United States Patent
Tu et al.

(10) Patent No.: US 6,780,731 B1
(45) Date of Patent: Aug. 24, 2004

(54) HDP GAP-FILLING PROCESS FOR STRUCTURES WITH EXTRA STEP AT SIDE-WALL

(75) Inventors: Yeur-Luen Tu, Taichung (TW); Tsung-Hsun Huang, Chungho (TW); Chung-Yi Yu, Hsin-Chu (TW); Yuan-Hung Liu, Hsin-Chu (TW)

(73) Assignee: Taiwan Semiconductory Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/225,803

(22) Filed: Aug. 22, 2002

(51) Int. Cl.[7] .............................................. H01L 21/76
(52) U.S. Cl. ........................ 438/424; 438/435; 438/695
(58) Field of Search ................................ 438/424, 426, 438/427, 428, 435, 437, 694, 695, 443, 696, 706, 778

(56) References Cited

U.S. PATENT DOCUMENTS

| | | | |
|---|---|---|---|
| 5,270,264 A | 12/1993 | Andideh et al. ............ | 437/228 |
| 5,920,792 A | 7/1999 | Lin ............................. | 438/633 |
| 6,030,881 A | 2/2000 | Papasouliotis et al. ...... | 438/424 |
| 6,037,018 A | 3/2000 | Jang et al. .................. | 427/579 |
| 6,200,911 B1 | 3/2001 | Narwankar et al. ......... | 438/758 |

*Primary Examiner*—Jack Chen

(57) ABSTRACT

A multi-step HDP deposition and sputtering process for void-free filling of high aspect ratio trenches having stepped cross-sectional profiles. The method is particularly applicable to filling trenches formed in triply layered substrates comprising a silicon first layer, an oxide second layer and a nitride third layer, wherein the nitride layer is pulled back from the edge of the trench opening and forms a step. The method allows the void-free filling of such a trench without dam aging the nitride layer in the process. Briefly, the essence of the method is the formation of deposited layers on the side walls of the trench wherein the first layer is deposited with a high deposition to sputtering ratio and low bias power to form a layer with an overhang at the upper surface of the trench. This deposition if followed by a sputtering process to form an enlarged opening in that overhang. This approach is found to prevent the formation of an overhang at the position of the step, whereat it would cause progressive restriction of the trench throat and void formation.

12 Claims, 3 Drawing Sheets

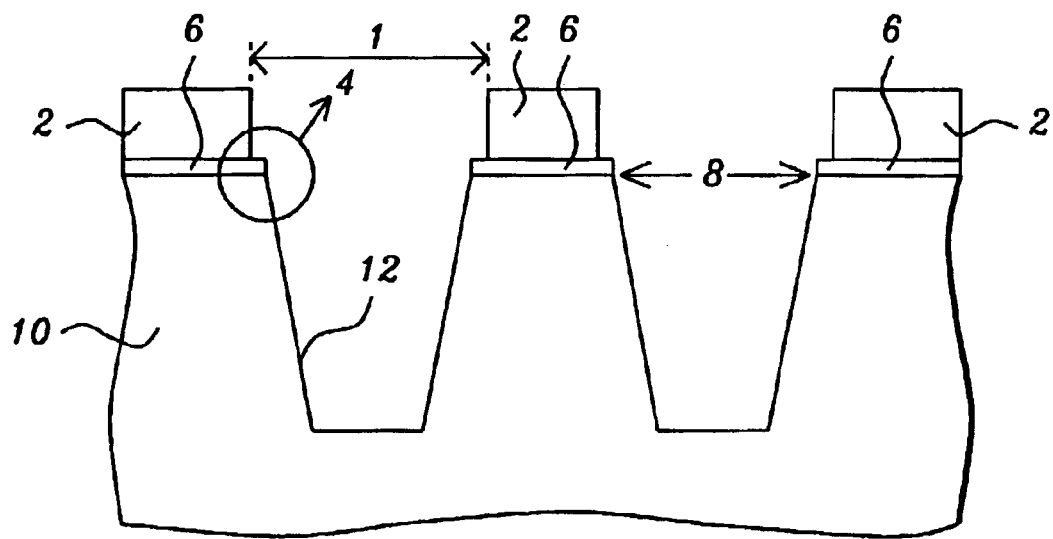
FIG. 1
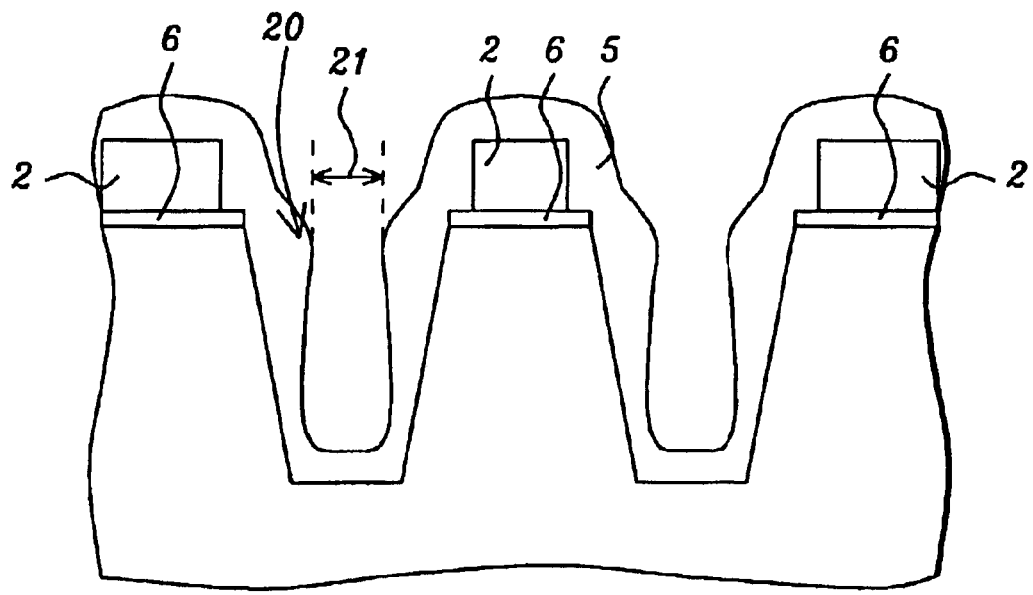
FIG. 2 - Prior Art

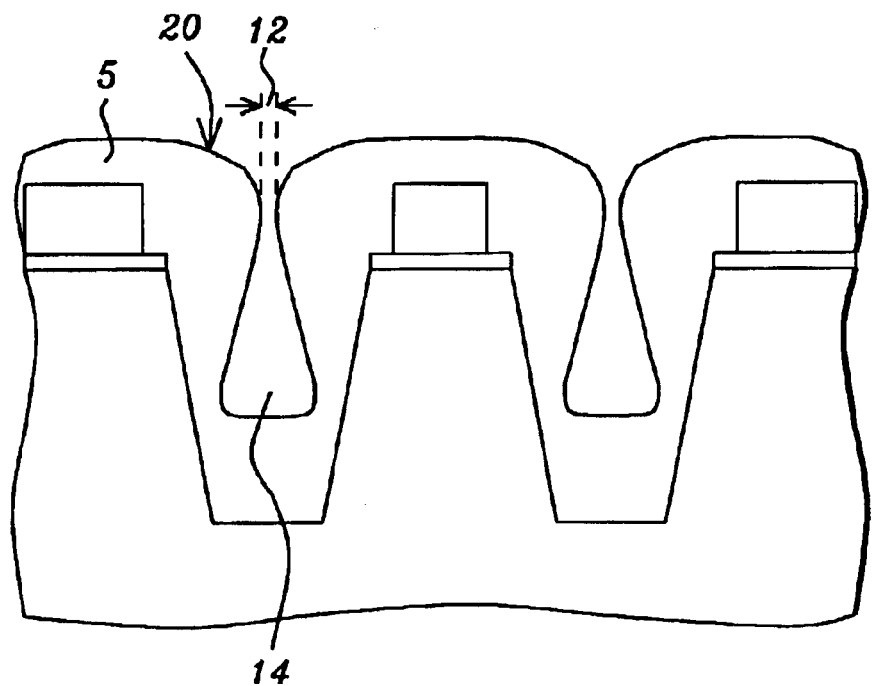
FIG. 3 – Prior Art
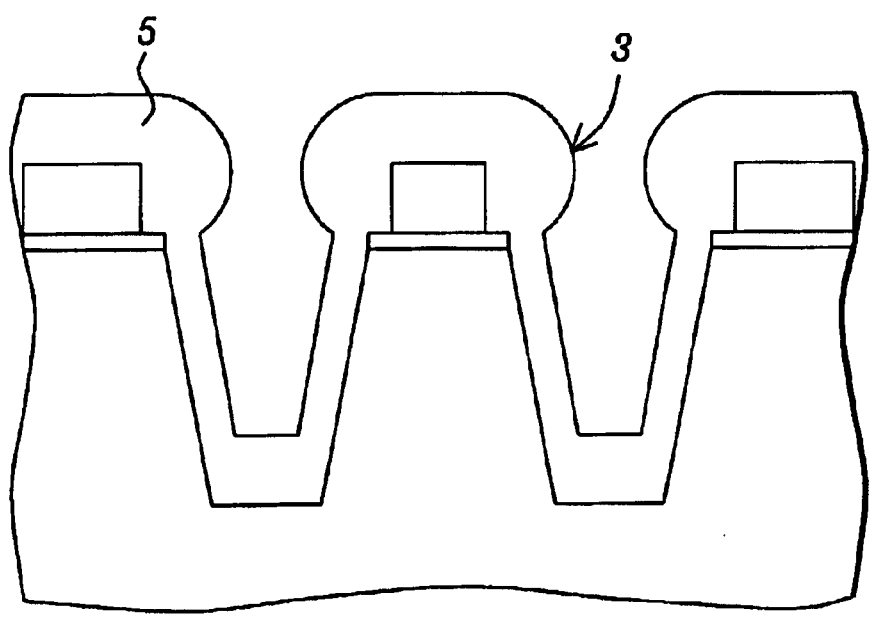
FIG. 4

HDP GAP-FILLING PROCESS FOR STRUCTURES WITH EXTRA STEP AT SIDEWALL

RELATED PATENT APPLICATION

This application is related to, Ser. No. 10/154,285, filing date May 23, 2002, assigned to the same assignee as the current invention.

BACKGROUND OF THE INVENTION

1. Field of the Invention

This invention relates generally to the fabrication of integrated circuits and, more specifically, to the use of a novel, multi-step, high-density plasma (HDP) method for filling gaps and trenches in integrated circuit structures which is particularly effective when said gaps and trenches have stepped cross-sectional profiles that would prevent void free and damage free filling by the usual methods.

2. Description of the Related Art

Many processes in the fabrication of integrated circuits require the formation of variously shaped trenches in the substrate and their subsequent filling, using sputtering and plasma enhanced deposition processes. For example, the fabrication of DRAM circuits requires dielectric and conductor filled trenches for the formation of storage capacitors. There are also a wide variety of circuit topologies (including DRAM circuits) that require portions of the circuit to be isolated from each other by shallow filled trenches ("shallow trench isolation" or STI). As circuits progressively shrink in size, the aspect ratio (depth/width) of these trenches become larger as their widths become appreciably smaller than their depths (widths with outside diameters <0.2 microns being common) and a subsequent complete and uniform filling is rendered problematic due to the angular distribution of the sputtered dielectric atomic species in the deposition process. In particular, such atoms tend to follow a line of sight trajectory, causing poor coverage on steeply slanted trench side walls. A particularly serious problem that results is the production of fills having internal voids. Compounding the problem of void formation is the fact that the trenches are often formed in multilayered substrates, such as silicon substrates on which there are successive layers of silicon oxides and silicon nitrides. It is not uncommon that the upper nitride layer is pulled back from the edge of the trench by amounts between 150–500 angstroms to reduce gate oxide thinning, which forms a stepped cross-sectional profile and then leads to a shadowing and overhang effect as the dielectric fill material is deposited within the trench. Another cause of voids during the filling process is a re-deposition effect associated with the use of argon as a sputtering gas.

The various problems associated with trench filling and methods of eliminating or reducing them have been noted in the prior art. Jang et al. (U.S. Pat. No. 6,037,018) teaches a method for filling shallow trenches (STI) with a high density plasma chemical vapor deposition (HPDCVD) oxide. The method so taught has a primary objective of protecting the trench side walls from the effects of the sputtering process by first depositing an $O_3$-TEOS barrier layer. The method, however, does not specifically address the problem of void formation. Andideh et al. (U.S. Pat. No. 5,270,264) teach a method for filling gaps between metal lines on integrated circuits by means of inter layer dielectric (ILD) deposition using plasma enhanced chemical vapor deposition (PECVD). The method involves three steps, (1) CVD ILD deposition, (2) medium pressure argon sputter etch and (3) CVD ILD deposition. Lin (U.S. Pat. No. 5,920,792) teaches a method for depositing and planarizing dual HDP-CVD layers on integrated microelectronsics circuits. The layers are deposited using combined deposition and etch processes wherein the etching gas component is argon and the deposition component gas is silane. The HDP-CVD layers taught by Lin also provide a superior trench filling capability. Narwankar et al. (U.S. Pat. No. 6,200,911 B1) teaches a method for modifying the profile of narrow, high aspect ratio gaps on a semiconductor substrate so as to allow their filling in a void-free manner. The method taught by Narwankar involves differential heating of the top and bottom surfaces of the substrate, using an argon plasma for preheating purposes and by carefully controlling top and side coil plasma chamber power. Silane and argon were the gases utilized in this process. Papasouliotis et al (U.S. Pat. No. 6,030,881) teach a method for filling high aspect ratio gaps (>5:1) without the formation of voids. Specifically, the method encompasses a sequence of HDP deposition and etch steps having varying etch-to-deposition rate ratios, wherein the first step uses a rapid deposition in a gas mixture comprising oxygen, silane and argon or helium (an inert gas). This deposition is halted before voids are formed, following which there is applied a step with a more rapid etch rate so as to open up the entry to the partially filled trench. Thereupon, a sequence of deposition and etch steps are applied until the aspect ratio of the increasingly filled trench is low enough to allow a complete fill with a deposition step.

The method of Papasouliotis et al. is not directed at stepped-profile trench openings on substrates in which an upper nitride layer is pulled back from a lower pad oxide layer to prevent the gate oxide from thinning. Such stepped-profile openings, while advantageous, present considerable problems in trench filling as the step exacerbates the formation of overhangs. In addition, the method of Papasouliotis et al. teaches the use of an inert gas in the initial deposition step, whereas the present inventors have determined that the use of such a gas in the initial step will create nitride damage and enhance void formation by the process of redeposition. Further, the present invention uses a first process step in which there is a high deposition to sputtering ratio and a second step in which there is a low deposition to sputtering ratio, unlike the method taught by Papasouliotis, in which the first and second depositions are the same.

In general, none of the inventions cited above are directed at the problems posed by filling stepped-profile trenches. It is the experimental observation of the present inventors that filling stepped profile trenches using prior art processes will lead to void formation because the step produces an overhang within the trench which constricts the trench opening and prevents effective sputtering. This, in turn, causes an internal void as the filling process eventually closes the trench opening while the trench interior is not completely filled. It is in an effort to address the void formation problems associated with stepped-profile trench openings as well as to reduce the damage to the nitride layer caused by the sputter/etching process that the present invention is directed.

SUMMARY OF THE INVENTION

A first object of this invention is to provide a method for filling trenches in integrated circuits.

A second object of the present invention is to provide a method for filling trenches having a high aspect ratio without the resulting formation of voids within the filling material.

A third object of the present invention is to provide a method for filling high aspect ratio trenches having a stepped cross-sectional profile such as would be caused by the formation of said trenches in a substrate on which a nitride layer overlays an underlying oxide layer and wherein said nitride layer has been pulled back from the oxide layer at the trench opening.

A fourth object of the present invention is to provide a method for filling such high aspect ratio trenches in a substrate covered by an oxide and a nitride layer in a manner that avoids a redeposition effect and eliminates damage to the nitride layer, said damage causing problems for endpoint detection during the subsequent chemical mechanical polishing.

In accord with the objects of this invention there is provided a method for filling high aspect ratio trenches, and particularly such trenches formed in substrates in which a nitride layer overlays an oxide layer and is pulled pack from said oxide layer to form a stepped profile (see FIG. 1). Said method uses a multi-step high density plasma (HDP) deposition process in which the initial step has a high deposition to sputtering (D/S) ratio which is greater than 6, allowing the formation of a first deposited layer over the trench side walls and nitride layer of thickness between approximately 800–2000 A (angstroms), depending on trench dimensions, and forming an overhang at the top of the trench opening (see FIG. 4). The overhang so formed advantageously constricts the upper trench opening and thereby prevents the undesirable overhang at and immediately below the step of the trench opening. A subsequent in-situ sputtering using only argon or oxygen ions is then applied to remove the overhang and produce a wide trench opening at the mouth of the trench (see FIG. 5). The subsequent sputtered layer thickness is between approximately 400 and 1000 A, depending on the thickness of the first layer. The deposition and sputtering can be repeated for the formation of a properly sized opening. The final step involves an HDP gap filling, using a low D/S ratio of 6 or less, until the void-free fill reaches a desired level (see FIG. 6).

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein:

FIG. 1 is a schematic cross-sectional diagram of a trench formed in an oxide and nitride covered substrate. The stepped profile resulting from nitride pull-back is shown.

FIG. 2 (prior art) is a schematic representation of a stepped profile trench, such as that in FIG. 1, showing how low D/S HDP deposition forms an overhang at the step.

FIG. 3 (prior art) is a schematic representation of the process begun in FIG. 2, now carried to the point of trench throat closure and void formation. This would be a typical result of a later D/S ratio that is greater than 6, causing the overhang to move up and pinch off the throat.

FIG. 4 is a schematic representation illustrating the first deposition step of the present invention as applied to the trench of FIG. 1. The higher overhang position is shown, as well as the lack of overhang at the step.

DESCRIPTION OF THE PREFERRED EMBODIMENT

Figure 5:
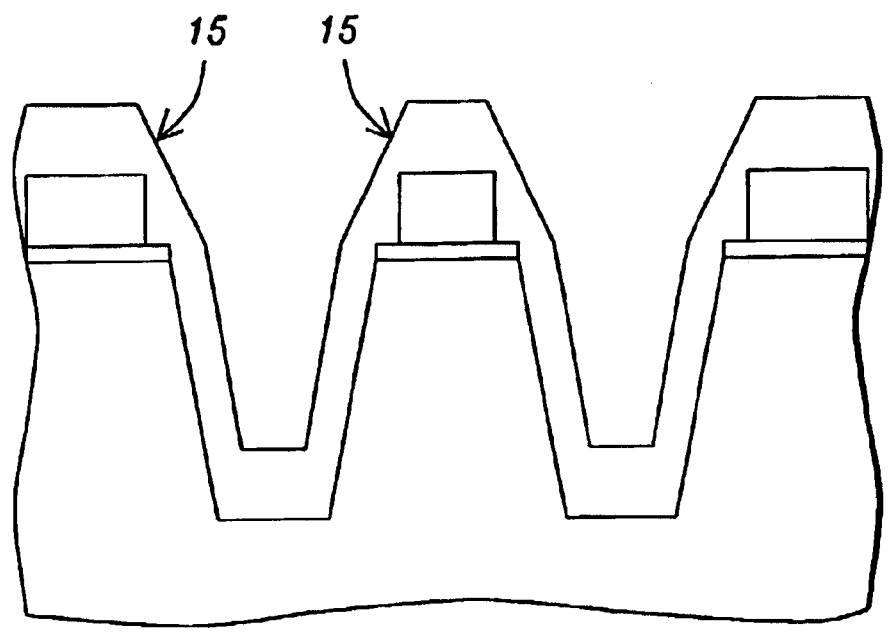
FIG. 5 is a schematic representation illustrating a subsequent in-situ sputtering step, using only a sputtering gas and creating an angled sidewall and open throat.

The preferred embodiment of the present invention provides a method of filling a high aspect ratio, stepped profile trench in a silicon nitride and silicon oxide overlaid silicon substrate, so that no voids are formed in the fill and so that damage to the nitride overlay is reduced or eliminated.

Referring first to FIG. 1, there is shown a schematic representation of the cross-section of a stepped-profile trench of the type that is effectively filled by the method of the present invention. The trench opening (1) is bordered by a portion of an overlying nitride layer (2), which is a silicon nitride layer and which has been pulled back between 150 and 500 A (angstroms) from the edge of a gate oxide layer (6), which is a silicon oxide layer, to expose the surface of the gate oxide layer and produce a step (4) (shown circled). The pull-back is typically achieved by use of a wet, hot $H_3PO_4$ etch to remove an annular region of the nitride layer around the initial trench opening. The "step" referred to is the discontinuous change in the trench diameter encountered in passing from the nitride layer to the oxide layer. The initial diameter of the trench opening (8), before pull-back of the nitride layer, is no greater than 0.2 microns and the trench penetrates the substrate (10), which is a silicon substrate in this embodiment, with fairly straight or slightly sloped sides (12).

Referring next to FIG. 2, there is shown a schematic representation of an early stage in the filling of a stepped-profile trench such as was represented in FIG. 1 in accord with methods of the prior art. This particular fill layer (5) resulted from the use of a deposition to sputter ratio (D/S) of 4.5, which is not in accord with the present invention, but which ratio would be fairly typical of the prior art. Significant overhang (20) of the layer caused by the step ((4) in Fig. 1) can already be seen, producing a restricted throat region (21) that shows the effects of inefficient sputtering at the sharp corners of the stepped profile. The pulled back nitride layer (2) is shown, as is the gate oxide layer (6).

Referring next to FIG. 3, there is depicted a schematic representation showing the next stage of a prior art deposition, typically carried out at a D/S ratio greater than 6. The overhang (20) has moved up as a result of increased deposition and pinches off the throat (12), leading to an internal void (14).

Referring next to FIG. 4, there is shown a schematic representation illustrating the first fill layer (5) of $SiO_2$ deposited in accord with a preferred embodiment of the method of the present invention. The deposition to sputter ratio is between 6 and 10 in this case. The sputtering gas is $O_2$ or Ar. The deposition (reactant) gases are $SiH_4$ and $O_2$ which react to form the $SiO_2$ layer. The deposition is carried out at low bias power (500–2000 W) to avoid damage to the nitride layer and to avoid re-deposition. The deposition time is approximately the same as that which produced the results depicted in FIG. 2, and is sufficient to produce a fill layer of thickness between approximately 500 and 2000 A. It can be seen, however, that unlike the situation in FIG. 2, there is an upper overhang (3) but no overhang at or below the step (as (20) in FIG. 2).

Referring next to FIG. 5, there is shown a schematic representation of the results of a subsequent in situ sputtering step applied to the deposition depicted in FIG. 4. In this step, there is only sputtering, using gases such as argon or oxygen as the sputtering gas, with argon being the preferred gas. Any deposition gases are turned off. The effect of this sputtering is to open up the throat (15) in the upper overhang region ((3) in FIG. 4).

Figure 6:
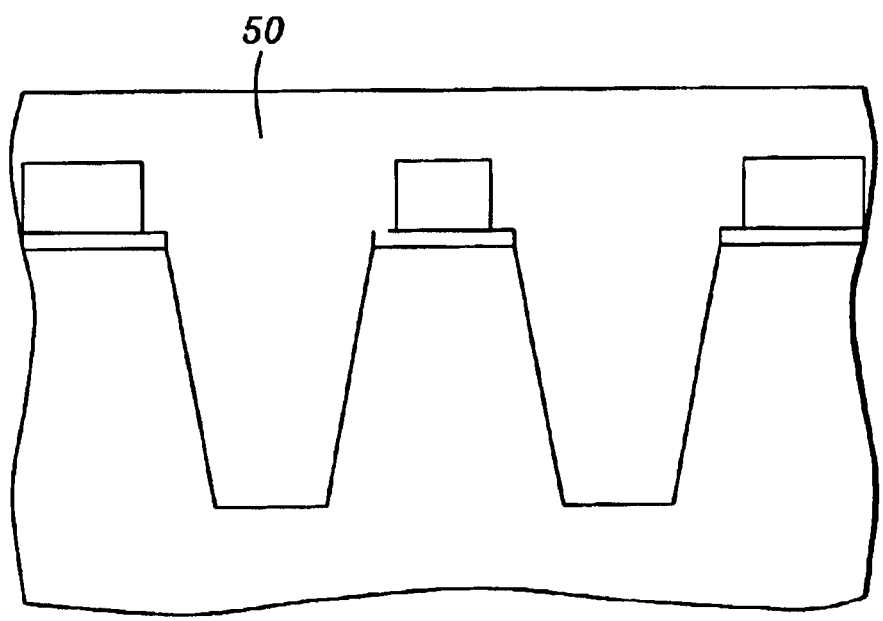
FIG. 6 is a schematic diagram illustrating a completed, void-free fill, said fill having been carried out to completion at a low D/S ratio.

As a result of this sputtering process, the first fill layer is brought to a thickness of between approximately 300 and 1200 A. Referring finally to FIG. 6, there is shown a schematic representation of a completed, void-free fill (50) which has been produced by a sequence of deposition and sputtering steps applied subsequent to the formation of the first fill layer as described above. These deposition and sputtering steps are carried out at a low D/S ratio of between approximately 2 to 6, using deposition gases of $SiH_4$ and $O_2$ and a sputtering gas of argon or oxygen or a mixture of argon and oxygen. These subsequent steps are normally considered to be complete when a deposition thickness of between approximately 1.1 and 1.3 times the total trench depth is achieved. The number of subsequent steps will be a function of the initial dimensions of the trench being filled as well as the deposition and sputtering rates deemed appropriate.

As is understood by a person skilled in the art, the preferred embodiment of the present invention is illustrative of the present invention rather than limiting of the present invention. Revisions and modifications may be made to methods, materials, structures and dimensions employed in the present method for void free and damage free filling of high aspect ratio stepped-profile trenches in oxide and nitride covered substrates, while still providing a method for void free and damage free filling of high aspect ratio stepped profile trenches in oxide and nitride covered substrates, in accord with the spirit and scope of the present invention as defined by the appended claims.

What is claimed is:

1. A method for void-free filling a trench of high aspect ratio and stepped profile in a layered substrate comprising:

providing a substrate comprising a first layer, over which is formed a second layer, over which is formed a third layer;

forming in said substrate a high aspect ratio trench with an initial opening diameter in said third layer and said trench having side walls extending through said third and second layers and into said first layer;

forming a step in the profile of the trench by removing an annular portion of the third layer surrounding said initial opening, thereby enlarging said initial opening diameter;

depositing over the exposed sideways of said trench an initial layer of filling material, using a first high density plasma (HDP) deposition and sputtering process to achieve a first thickness which constricts said enlarged initial opening producing an overhang above said step, said deposition and sputtering process using oxygen and silan as reactant gases during a deposition portion of said process and oxygen or argon as a sputtering gas during a sputtering portion of said process, and said deposition and sputtering process having a ratio of deposition rate to sputtering rate (D/S) which is between 6 and 20 and a low bias power between 500 and 2000 W;

sputtering said initial layer, in the presence of only the sputtering gas to eliminate said overhang and produce, thereby, a trench which is widest at an upper portion;

depositing additional layers of filling material on the side walls of said trench, in a subsequent sequence of HDP deposition and sputtering processes using said reactant gases, sputtering gases of oxygen or argon or a mixture of oxygen and argon, and a ratio of deposition rate to sputtering rate (D/S) between 2 and 6;

terminating said HDP deposition and sputtering process sequence when the trench has been filled to a height above the surface of the substrate.

2. The method of claim 1 wherein the first layer is a layer of semiconductor material, the second layer is an oxide layer and the third layer is a nitride layer.

3. The method of claim 2 wherein the semiconductor material is silicon.

4. The method of claim 3 wherein the oxide layer is silicon oxide and it is formed to a thickness of between approximately 80 and 150 angstroms.

5. The method of claim 3 where in the nitride layer is a layer of silicon nitride and it is formed to a thickness of between approximately 1200 and 2000 angstroms.

6. The method of claim 5 wherein the annular portion of the silicon nitride layer is removed by a process using an etch of hot $H_3PO_4$.

7. The method of claim 6 wherein the removal of the annular portion of the silicon nitride layer results in a pulling back of the initial opening diameter of the trench opening by an amount between approximately 150 and 500 angstroms.

8. The method of claim 5 wherein the initial opening diameter of the trench opening is not more than approximately 0.2 microns.

9. The method of claim 1 wherein the initial layer of trench filling material is a layer of $SiO_2$ deposited to a thickness of between approximately 500 and 2000 A and has an overhang above the trench step but no overhang at the trench step or beneath it.

10. The method of claim 1 wherein the deposition and sputtering are carried out with a first bias power which is low to avoid damage to the nitride layer.

11. The method of the claim 1 wherein the sputtering of said initial layer using only a sputtering gas is earred out to achieve a layer having no overhang above the step and a thickness of between approximately 300 and 1200 angstroms.

12. The method of claim 1 wherein said process is terminated when the height of the fill is between approximnately 1.1 and 1.3 times the initial the trench.

* * * * *